United States Patent [19]

Caspari

[11] 3,946,329

[45] Mar. 23, 1976

[54] ELECTRONIC AUTOMATIC FREQUENCY TUNING SYSTEM

[75] Inventor: Fred W. Caspari, South Bend, Ind.

[73] Assignee: The Magnavox Company, Fort Wayne, Ind.

[22] Filed: June 5, 1974

[21] Appl. No.: 476,645

[52] U.S. Cl. .................... 331/4; 325/421; 325/423; 331/11; 331/19; 331/20; 331/31; 331/34
[51] Int. Cl.²......................................... H03B 3/04
[58] Field of Search.................... 331/1 R, 4, 10–12, 331/18, 19, 30, 31, 34, 20; 325/421, 423

[56] References Cited
UNITED STATES PATENTS

| | | | |
|---|---|---|---|
| 3,611,175 | 10/1971 | Boelke............................. | 331/11 X |
| 3,703,686 | 11/1972 | Hekimian.............................. | 331/11 |
| 3,736,513 | 5/1973 | Wilson.............................. | 331/19 X |
| 3,852,682 | 12/1974 | Dawe et al......................... | 331/12 X |

Primary Examiner—Siegfried H. Grimm
Attorney, Agent, or Firm—William J. Streeter; Thomas A. Briody; Joe E. Barbee

[57] ABSTRACT

Apparatus and method for providing an automatic frequency tuning system capable of supplying a local oscillator signal with a preselected frequency. The frequency of an output signal of the local oscillator is electronically varied across a frequency region which includes the preselected frequency. The output signal of the local oscillator is combined with the output signal of a reference signal generator. After the combination of the local oscillator signal with the reference oscillator signal produces a preestablished condition which is the result of the local oscillator signal attaining the preselected frequency, the frequency of the local oscillator signal is held constant. The local oscillator signal is thereafter compared to the reference oscillation signal and a change in the local oscillator signal frequency is corrected by means of an automatic frequency control feedback loop containing a discriminator circuit.

10 Claims, 4 Drawing Figures

ELECTRONIC AUTOMATIC FREQUENCY TUNING SYSTEM

BACKGROUND OF THE INVENTION

1. Field of the Invention

This invention relates generally to apparatus for automatically tuning an oscillator to a preselected frequency, and more particularly to an automatic tuning circuit for use with a plurality of information-bearing frequency channels systematically dispersed throughout a range of frequencies. Upon identification of a condition resulting for the attainment of the preselected frequency by the oscillator output signal, an automatic frequency control (AFC) circuit is used to stabilize the frequency of the oscillator signal.

2. Description of the Prior Art

An automatic frequency control circuit typically is comprised of a local oscillator, a signal mixing circuit such as a heterodyne conversion transducer, an amplifier tuned to a predetermined intermediate frequency and a discriminator circuit designed to operate about the predetermined intermediate frequency. The output signal of the discriminator controls the frequency of the output signal of the local oscillator. A received signal, for which demodulation is desired, is typically applied to the mixing circuit. The combination of the received signal and the local oscillator signal produces an intermediate frequency signal which is applied to the tuned amplifier. The output signal of the local oscillator is used to convert the received signal and the relationship between the local oscillator signal frequency and the received signal frequency is stabilized by the circuit.

It is known in the prior art to provide an AFC circuit with mechanical apparatus for providing the coarse adjustment of the local oscillator. The coarse adjustment typically places the intermediate frequency signal within the operating range of the tuned amplifier and the discriminator circuit. The AFC circuit thereafter provides the vernier tuning for the satisfactory demodulation of the received signal. Because of problems associated with deterioration of mechanical apparatus, it is desirable to provide coarse adjustment by elctronic means.

The characteristics of the tuned amplifier and more importantly, the discriminator circuit, provide the limit for the range over which a received signal can be stabilized and demodulated. Providing an expanded frequency range for these characteristics, for example to provide greater signal tuning capability, would increase the possibility of identifying and demodulating an undesired signal falling within the range of the amplifier and discriminator characteristics.

Furthermore, in conventional AFC circuits, the loss of the received signal, which contributes to the intermediate frequency signal, can produce undesirable drift in the frequency of the local oscillator output signal.

There are many applications, such as commercial broadcast television, where the received signal (i.e. the signal transmitted by the television station) is rigidly controlled. The AFC circuit originally was provided to minimize the effects on the operation of a television receiver of frequency shifts in the local oscillator. Shifts of the broadcast signals are unimportant, so that the necessity for utilizing the received signal in the AFC loop is minimized. It is desirable, however, to provide for control of the local oscillator by the received signal, the reference signal controlling the local oscillator output signal frequency in the absence of the received signal.

It is therefore an object of the present invention to provide an improved automatic frequency tuning circuit.

It is another object of the present invention to provide an automatic frequency tuning circuit capable of electronic coarse adjustment over a preestablished frequency spectrum.

It is a further object of the present invention to provide an automatic electronic frequency tuning circuit for information-bearing channels in a wide frequency range without compromising fine tuning capability.

It is yet another object of the present invention to provide apparatus for stabilizing a local oscillator output signal by means of an AFC circuit during temporary loss of received signal.

It is a more particular object of the present invention to provide a voltage controlled oscillator and a controllable voltage source in an automatic frequency tuning circuit for sweeping the frequency of the oscillator signal across a frequency spectrum in which at least one desired information-bearing frequency band is located.

It is still another particular object of the present invention to provide apparatus for suspending scanning over a range of frequencies by an oscillator signal in an AFC circuit at a frequency determined by a reference frequency signal.

It is yet another particular object of the present invention to provide apparatus for comparing a signal having a varying frequency with a reference frequency signal in order to identify a predetermined frequency of the varying signal.

It is yet another object of the present invention to provide an electronic automatic frequency tuning circuit with a reference freqeuncy signal, which maintains a substantially constant oscillator frequency during loss of the received signal.

It is yet a further object of the present invention to provide an electronic automatic frequency tuning circuit having a first feedback loop for identifying a predetermined oscillator signal frequency and a second feedback loop for maintaining the predetermined oscillator signal.

It is a still further object of the present invention to provide an electronic automatic frequency tuning circuit which, upon entry of data, can identify and maintain an oscillator signal having a frequency determined by the entered data.

It is yet another particular object of the present invention to provide an AFC circuit utilizing a received signal for control of the local oscillator, the local oscillator controlled by a reference signal in the absence of the received signal.

It is another object of the present invention to provide for relatively rapid response for circuits controlling scanning of a frequency region by the output signal of a local oscillator, while providing a relatively slow response for stabilization of signals stabilizing the frequency of the local oscillator output signal.

It is yet another object of the present invention to provide an amplifier permitting the same discriminator circuit to be used in an AFC circuit with a beat frequency signal above and with a beat frequency signal below the frequency of the reference signal generator being utilized by the AFC circuit.

SUMMARY OF THE INVENTION

The aforementioned and other objects are accomplished, according to the present invention, by an electronic automatic frequency tuning circuit comprising two sets of apparatus for controlling the signal of variable frequency local oscillator. The first set of apparatus varies the frequency of the local oscillator until a predetermined relationship between the local oscillator signal and a reference generator signal is identified. Upon identification of the predetermined relationship, the second set of apparatus stabilizes the frequency of the oscillator output signal at substantially constant value. To stabilize the frequency of the oscillator signal, the reference generator signal and the local oscillator signal are combined and a resulting difference frequency signal applied to a discriminator. The discriminator provides an output signal which applies a control signal to the oscillator resulting in oscillator signal frequency corrections compensating for changes in the oscillator signal frequency.

The automatic frequency tuning circuit is not dependent on the received signal, the signal for which demodulation is typically desired, and therefore a loss of the received signal does not affect the frequency of the oscillator signal. However, in the presence of the received signal, an AFC circuit utilizing the received signal controls the frequency of the local oscillator output signal.

The reference oscillator can be apparatus for producing a comb of harmonic frequencies. By varying the controllable oscillator signal frequency beginning at a known initial value, the number of signals resulting from a preselected relationship, e.g. predetermined beat frequencies, occurring between the reference oscillator signal and the variable oscillator can be used to determine the predetermined relationship. Apparatus is provided for increasing and for decreasing the frequency of the local oscillator. In the AFC circuit utilizing the oscillator and generator signals, an amplifier is utilized permitting a single discriminator circuit to be employed with either the beat frequency falling above or the beat frequency falling below the related reference generator component.

These and other features of the invention will be understood upon reading of the following description along with the drawings.

DESCRIPTION OF THE PREFERRED EMBODIMENT

Detailed Description of the Figures

Figure 1:
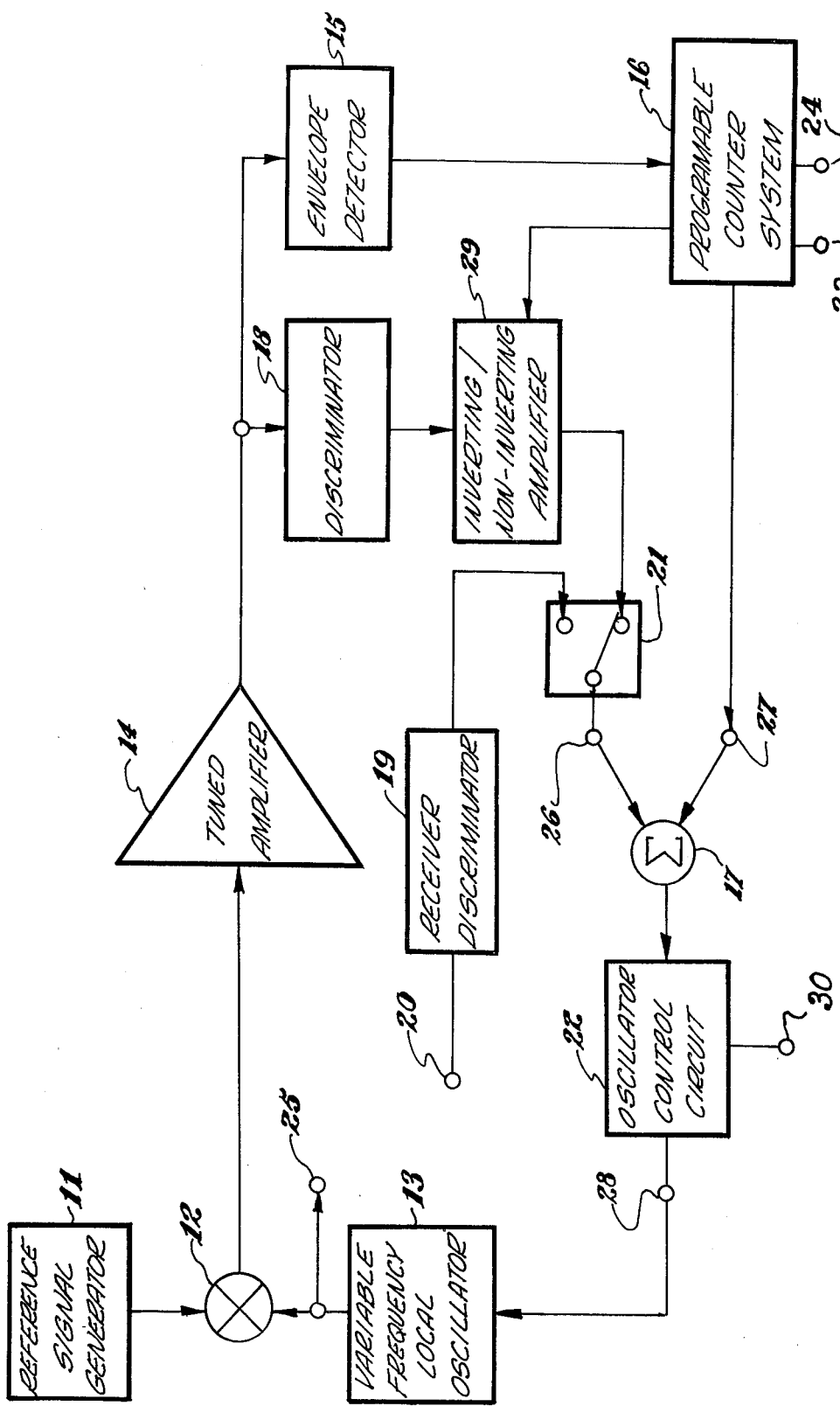
FIG. 1 is a block diagram of the electronic automatic frequency tuning circuit according to the present invention.

Referring first to FIG. 1, a controllable frequency local oscillator 13 provides a signal having a frequency determined by an output signal from oscillator control circuit 22. In the preferred embodiment, the local oscillator is comprised of a voltage controlled oscillator. The output signal of oscillator 13 is applied to mixing circuit 12 and to terminal 25. Mixing circuit 12 is a heterodyne conversion transducer in the preferred embodiment. An output signal from reference signal generator 11 is also applied to mixing circuit 12. The output signal of mixing circuit 12 is applied to tuned amplifier 14. The output signal of amplifier 14 is applied to discriminator 18 and to envelope detector 15. Discriminator 18 is a circuit for providing output signal whose amplitude is dependent upon the frequency of an input signal. Envelope detector 15 produces an output signal which is substantially the envelope of an input signal. Reference signal generator 11 can consist of apparatus for providing a single frequency output signal, an output signal having a plurality of frequencies or an output signal comprising a comb of harmonic frequency components.

The output signal of envelope detector 15 is applied to programmable counter system 16. According to the preferred embodiment, programmable counter system 16 applies a positive signal through terminal 27 to a summing network 17 upon removal of a reset signal applied to terminal 23 of system 16. The positive signal is removed from the output of system 16 upon identification of a given number of pulses, applied by detector 15 to system 16. The number of pulses required to remove the positive signal from the output of system 16 can be changed by signals applied to terminal 24.

The output signal of discriminator 18 is applied to inverting/noninverting amplifier 29. Amplifier 29 is coupled to system 16 and the output signal of amplifier 29 is coupled to one input terminal of a switch 21. An output signal from a receiver discriminator 19 is applied to a second input terminal of switch 21. An output terminal of switch 21 is coupled through terminal 26 to summing network 17. The output signal from the summing network 17 is applied to oscillator control circuit 22. An input terminal 30 for applying a reset signal is coupled to oscillator control circuit 22. This reset signal establishes the initial value of signal applied to terminal 28 and consequently to oscillator 13, thereby initializing the frequency of the oscillator signal.

Figure 2:
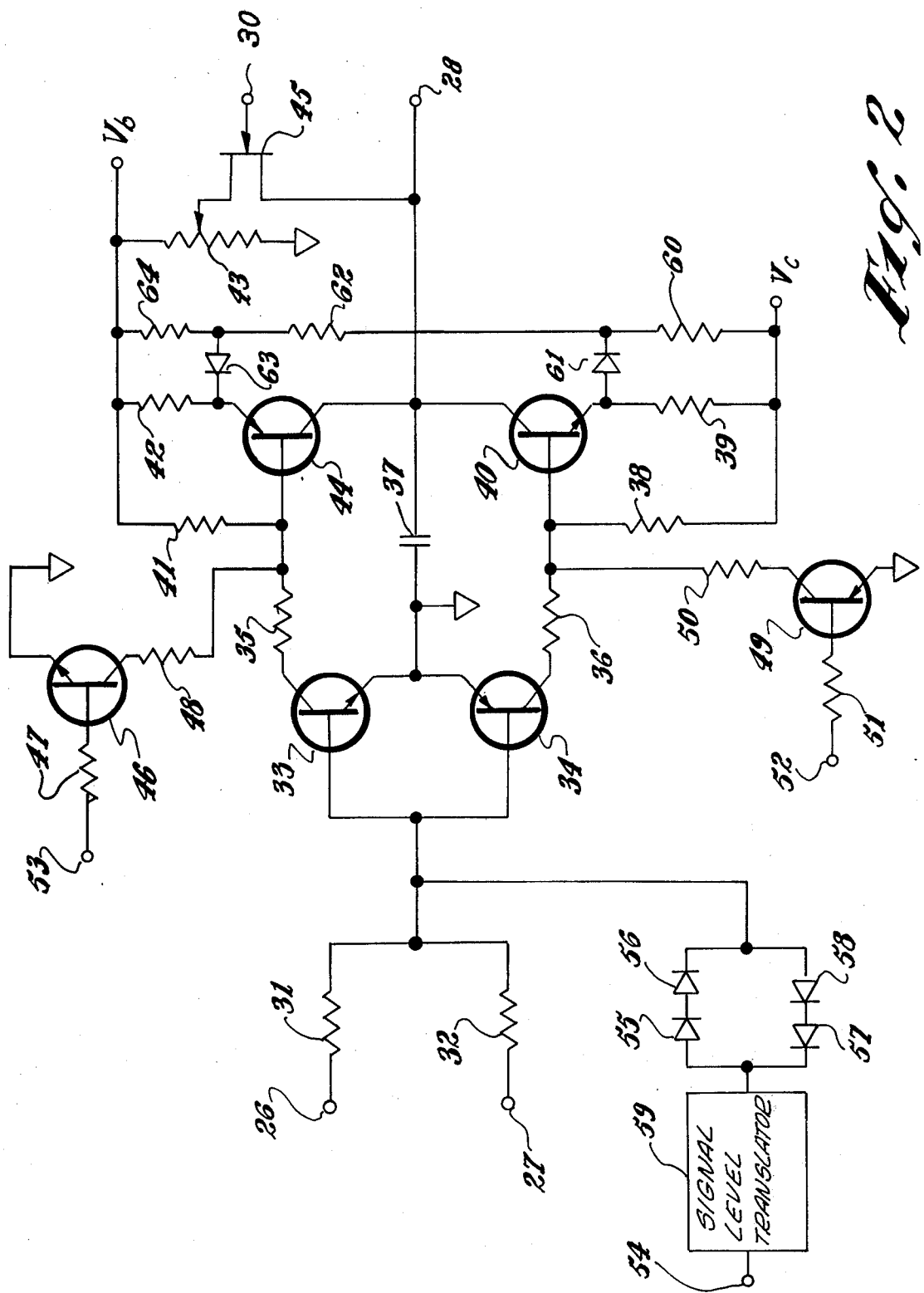
FIG. 2 is a circuit diagram according to the preferred embodiment, of the apparatus producing the input signal of the voltage controlled oscillator.

Referring next to FIG. 2, a circuit diagram of the summing network 17 and the oscillator control circuit 22 is shown. Terminal 26 is coupled to a first terminal of resistor 31. A second terminal of resistor 31 is coupled through resistor 32 to terminal 27, to a base of pnp 34, and a base of npn transistor 33. An emitter of transistor 33 and an emitter of transistor 34 are coupled to a common terminal. The collector of transistor 33 is coupled through resistor 35 to a first terminal of resistor 41 and to a base connection of pnp transister 44. A potential source $v_b$ is coupled to a second terminal of resistor 41, through resistor 42 to an emitter of transistor 44, and through potentiometer 43 to the common terminal. The variable connection of potentiometer 43 is coupled to a drain terminal of field effect transistor 45. A gate terminal of transistor 45 is coupled to terminal 30, while a source terminal of transistor 45 is coupled to terminal 28.

A collector terminal of transistor 34 is coupled through resistor 36 to a base terminal of npn transistor 40 and to a first terminal of resistor 38. A potential source $v_c$ is coupled to a second terminal or resistor 38 and, through resistor 39, to an emitter terminal of transistor 40. Terminal 28 is coupled to a collector terminal of transistor 44, a collector terminal of transistor 40 and through capacitor 37 to the common terminal.

A collector of npn transistor 46 is coupled through resistor 48 to the base connection of transistor 44. An emitter of transistor 46 is coupled to the common terminal, while the base connection of transistor 46 is coupled through resistor 47 to terminal 53.

A collector of pnp transistor 49 is coupled through resistor 50 to the base connection of transistor 40. The emitter of transistor 49 is coupled to a common terminal, while the base connection of transistor 49 is coupled through resistor 51 to terminal 52.

The emitter connection of transistor 44 is coupled to a cathode of diode 63. The anode of diode 63 is coupled through resistor 64 to voltage source $V_b$ and through resistor 62 to a cathode of diode 61. The cathode of diode 61 is also coupled through resistor 60 to voltage source $V_c$, while an anode of diode 61 is coupled to the emitter connection of transister 40.

The base connections of transistors 33 and 34 are coupled to a cathode of diode 56 and to an anode of diode 58. An anode of diode 56 is coupled to a cathode of diode 55, while the anode of diode 55 is coupled to an output terminal of signal level transistor 59. The cathode of diode 58 is coupled to an anode of diode 57 while a cathode of diode 57 is coupled to the output terminal of translator 59. The input terminal of translator 59 is coupled to terminal 54.

Figure 3A:
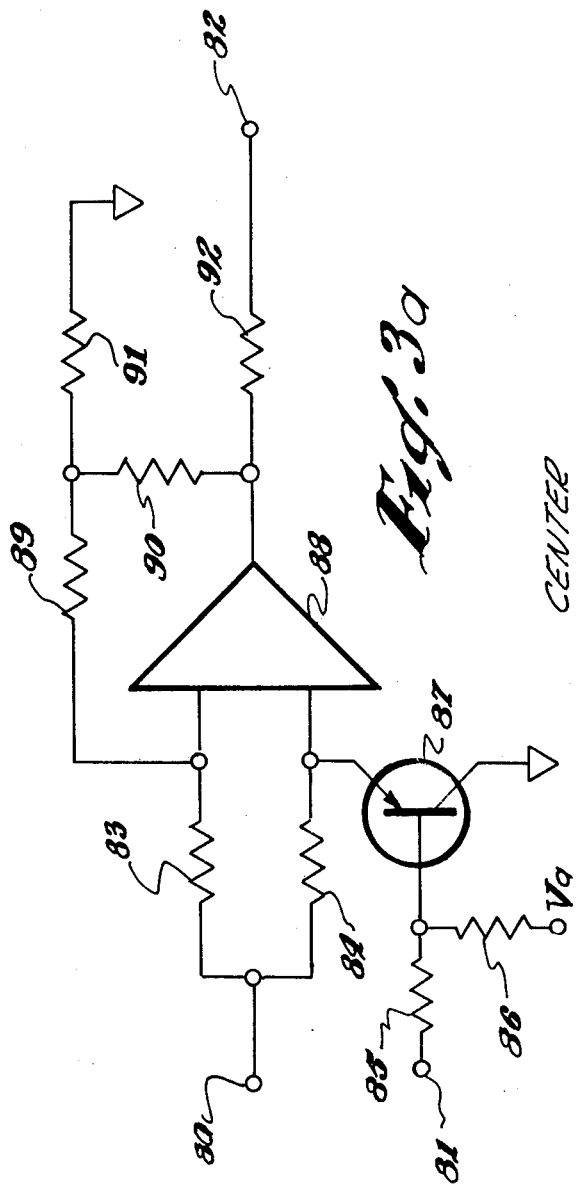
FIG. 3 is a circuit diagram of a discriminator amplifier which provides an amplified discriminator output signal in response to a first signal and which provides an inverted and amplified discriminator output signal in the absence of the first signal.
FIG. 3b is a pair of graphs showing the response of the envelope detector and the response of the discriminator as local oscillator frequency is varied in the region of a reference frequency.

Referring now to FIG. 3a, a circuit diagram for the inverting/noninverting amplifier 29 coupled between discriminator 18 and switch 21 is shown. Terminal 80 is coupled through resistor 83 to a first input terminal of amplifier 88, and through resistor 84 to a second input terminal of amplifier 88. An output terminal of amplifier 88 is coupled, through resistor 92 to terminal 82 and is coupled to a first terminal of resistor 90. A second terminal of resistor 90 is coupled through resistor 91 to the common terminal and through resistor 89 to the first input terminal of amplifier 88.

The second input terminal of amplifier 88 is coupled to a collector terminal of transistor 87. The emitter terminal of transistor 87 is coupled to the common terminal. The base of transistor 87 is coupled through resistor 85 to terminal 81 and through resistor 86 to potential source $V_a$.

Figure 3B:
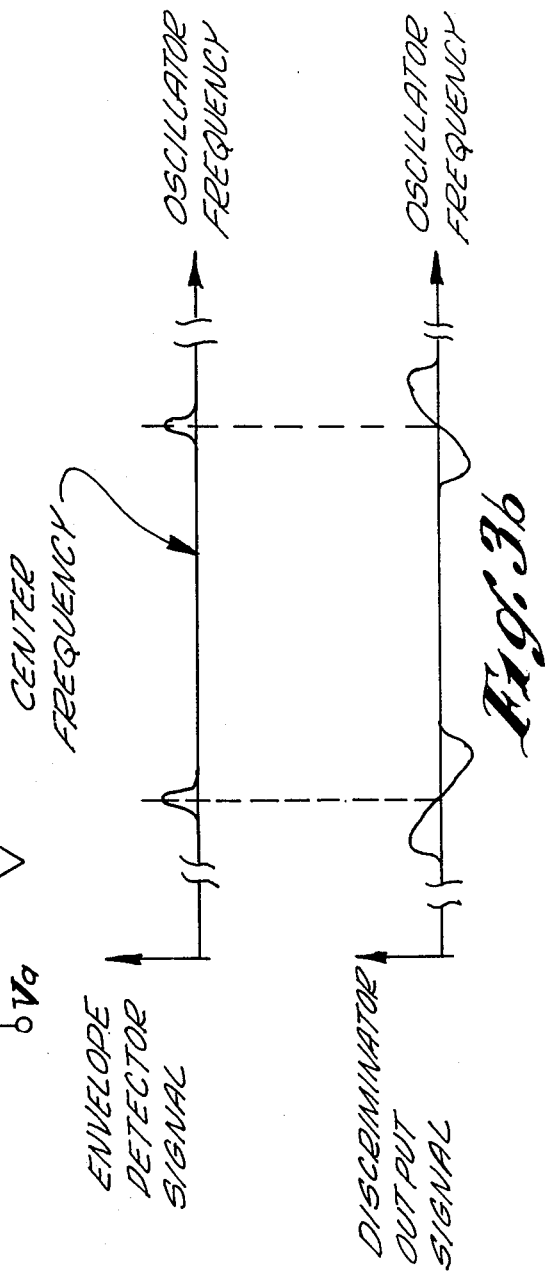

Referring now to FIG. 3b, the function of the inverting amplifier used in conjunction with discriminator 18 is shown. The upper diagram shows the envelope of constant amplitude beat frequency signal relative to a center frequency. The center frequency shown in FIG. 3b, in the preferred embodiment, can be of the frequencies of a comb of harmonic frequency signals. The lower diagram indicates how the output of the discriminator must be reversed, depending upon the use of the upper or lower beat frequency in the automatic frequency tuning circuit. As will be apparent to those skilled in the art, for the beat frequency positioned below the center frequency, as the local oscillator increases, the beat frequency decreases. For the beat frequency position above the center frequency, as the local oscillator increases, the beat frequency increases.

Operation of the Preferred Embodiment

The output signal of the frequency-controllable local oscillator 13 provides a frequency to be used in a receiver unit coupled to terminal 25. Typically, the local oscillator frequency is mixed or heterodyned with a received or broadcast signal to produce a single intermediate difference frequency to which succeeding receiver circuits are tuned. The intermediate frequency furthermore responds to changes in frequency of the broadcast signal by corresponding changes in the intermediate. In the preferred embodiment, the local oscillator 13 is comprised of a voltage controlled oscillator. However, signals broadcast by television transmitter typically have relatively stable and well-defined frequencies permitting the use of an internal frequency signal source in an automatic frequency tuning system.

The output signal from the voltage controlled oscillator is mixed or heterodyned with a signal having a frequency spectrum determined by an internal oscillator comprising part of the reference signal generator such as a crystal oscillator. The output signal from the reference signal generator is mixed with the output signal from the voltage controlled oscillator in mixing circuit 12.

In the preferred embodiment, the tuned amplifier 14 is tuned to 1 MHz, so that when the frequency of the local oscillator signal and a frequency component of the signal generator differ by 1 MHz, a signal will be produced at the output terminal of amplifier 14.

The output of amplifier 14 is applied to an envelope detector 15 and to discriminator 18. As the oscillator 13 is providing a signal with changing frequency, the output signal of the envelope detector is typically a pulse and is applied to a programmable counter system 16. Upon removal of the reset signal, programmable counter system 16 applies a positive signal to terminal 27 of oscillator control circuit 22. This positive signal produces a continuously increasisng voltage level at the output terminal of the oscillator control circuit 22. The increasing voltage level causes the voltage controlled oscillator to provide a signal having increasing frequency.

However, when a predetermined number of pulses have been received by system 16 from envelope detector 15, the signal applied to terminal 27 causing the oscillator control circuit 22 to produce an increasing voltage is removed and the loop formed by the discriminator 18 and the inverting noninverting amplifier 29 determines the signal controlling voltage controlled oscillator 13. In the preferred embodiment, the positive signal from the program system 16 supercedes output signal from amplifier 29. The coupling of the discriminator 18 in an automatic frequency control type circuit provides the stabilization of the frequency of the voltage controlled oscillator signal. It will be clear that the output of the discriminator circuit must be inverted when the beat frequency above the center frequency, as opposed to below the center frequency, is chosen. In the preferred embodiment, a signal from system 16 automatically controls the mode of operation of amplifier 29. It will be apparent that the signal generated by the signal generator 11, as well as the frequency to which amplifier 14 is tuned, must be selected in an appropriate manner so that the output signal frequency of the voltage controlled oscillator signal provides desired frequency.

According to one embodiment, the programmable counter can count beat frequency signal resulting from the mixing of the changing voltage controlled oscillator signal and a comb harmonic frequency signal produced by generator 11. Upon appropriate identification of preselected counts, the AFC loop including discriminator 18, stabilizes the oscillator output frequency. According to another embodiment, a particular frequency can be produced by the reference signal generator 11 and the first beat frequency identified by the system 16 can cause the automatic frequency control loop to provide appropriate oscillator stabilization. The frequencies to which the system can be tuned are determined by the frequencies available from the signal generator 11 as well as the frequency to which amplifier 14 is tuned.

It will be apparent to those skilled in the art that the initial frequency of the oscillator cannot be arbitrary. Therefore, a reset signal is applied to terminal 30 of control circuit 22. This reset signal causes a voltage determined by the position of the variable terminal of potentiometer 43 to be applied to oscillator 13 thereby determining an initial frequency. Similarly, the positive signal applied by system 16 to control circuit 22 must be applied upon removal of the reset signal from terminal 23 of system 16. In addition, the reset signal is used to reset the counting circuits of system 16. Following counter-resets, terminal 24 is used to provide system 16 with information designating the stabilized oscillator signal frequency by specifying conditions for removal of the positive signal from control circuit 22.

The circuit of FIG. 2 shows the oscillator control circuit and the summing circuit of the preferred embodiment. The reset signal is applied via terminal 30 to the gate terminal of transistor 45. The capacitor 37 is charged or discharged to a value determined by the position of the variable element of potentiometer 43. Thereafter, the positive signal applied to terminal 27 causes the capacitor to store an increasing amount of charge resulting in an increasing voltage at terminal 28. Upon identification of the specified signal (e.g. a defined number of pulses) from the envelope detector 15, the positive signal is removed from terminal 27 and from control circuit 22. Thereafter, drift in oscillator frequency, caused by changes of the charge of the capacitor or other changes are corrected by means of the feedback loop including discriminator 18. An error signal applied by amplifier 29 to terminal 26 of summing network 17 is used to correct for the frequency variations. The capacitor 37 provides a memory maintaining the desired frequency over a period of time.

In certain applications, a channel translator and other apparatus is used for changing the frequency of information channels. Such apparatus can compromise the information signal frequency stability that exists, for example, in commercial television broadcast signals. A receiver discriminator 19 can be placed in a feedback loop, replacing discriminator 18. In this instance, the center frequency of the discriminator will be determined by the mixing of a received (i.e. broadcast) signal and the voltage controlled oscillator signal. The voltage controlled oscillator is used to "track" or follow the drifting of the received signal ensuring appropriate operation of intermediate frequency apparatus. Capacitor 37 can still provide a memory for a temporary loss of received signal. The circuit parameters associated with capacitor 37 are arranged to provide a relatively slow response to input signals, thereby minimizing possible deleterious effects due to the presence of the AFC feedback loop. It will be clear to those skilled in the art, it is possible to provide switch 21 with apparatus for replacing discriminator 19 with discriminator 18 upon loss of received signal. In the preferred embodiment, the output signal of discriminator 19 is applied to terminal 54 and consequently to a signal level translator, providing the discriminator output signal with a d.c. bias signal. The diodes 55, 56, 57, and 58 provide a threshold circuit for signals from translator 59. The threshold circuit provides for rejection of small noise-induced signals which can otherwise provide a spurious change in the local oscillator operating frequency. The circuit parameters are chosen, in the preferred embodiment, so that the output signal of discriminator 19, resulting from a mixing of the signal from oscillator 13 and the received signal, have a greater effect on transistors 33 and 34 than do the signals from amplifier 29. However, upon fading of the received signal, the signal from amplifier 29, applied to terminal 26 in FIG. 2, stabilizes the frequency of the output signal of oscillator 13. Therefore, the apparatus of translator 59 and the threshold network comprised of diodes 55, 56, 57, and 58 provide the function of the switch 21 shown schematically in FIG. 1. As will be clear to those skilled in the art, the implementation described does not result in discrete switch positions.

A positive signal, applied to terminal 81, will cause the amplifier shown in FIG. 3a, to amplify with a polarity inverted from that when the positive signal is removed. Thus, only one amplifier is needed at the output of discriminator 18. The application of the positive signal at terminal 81 is determined in the preferred embodiment by circuits associated with system 16. The identification of a beat frequency above or the beat frequency below a center frequency will determine the state of amplifier 29. This decision can be determined by appropriate logic in progammable system 16.

One feature of the present invention is to utilize the charge storage of capacitor 37 as a short term storage mechanism for maintaining a substantially constant voltage at terminal 28 for periods of time dependent on the properties of the associated circuit. Furthermore, the circuit values are arranged to provide relatively slow response to input signals thereby minimizing possible deleterious effects resulting from the presence of the AFC feedback loop. It is desirable, however, to provide for frequency changes of the signal from oscillator 13 that are more rapid, during the scanning of the frequency range, than can be accommodated by the steady state circuit elements. In addition, certain applications are best implemented by apparatus that can provide a relatively rapid negative as well as positive scan of a frequency region by the output signal of oscillator 13. To provide for this mode of operation, a signal is applied to terminal 53 when relatively rapid charging of capacitor 37 is desired and a signal is applied to terminal 52 when relatively rapid discharge of capacitor 37 is desired. These signals place second resistances in parallel with load resistor 42 and load resistor 39 decreasing the time constant for charging capacitor 37.

In the AFC mode, the inputs at terminals 52 and 53 of the circuit of FIG. 2 are at zero volts. Therefore, transistors 46 and 49 are biased to cutoff and act substantially as open circuits between resistor 48 and ground and between resistor 50 and ground, respectively.

The discriminator signals are applied through the summing network to the bases of transistors 33 and 34. If the local oscillator frequency is too low, the discriminator output voltage will be positive. Therefore, the emitter-base junction of transistor 34 will be reverse biased (keeping transistor 34 biased off) and the emitter-base junction of transister 33 will be forward biased (biasing transistor 33 into conduction).

The base of transistor 44 is normally biased to a positive voltage ($V_v$) by resistor 41, maintaining transistor 44 at cutoff when transistor 33 is at cutoff. However, when transistor 33 conducts, the voltage at the base of transistor 44 is shifted toward zero, forward biasing the emitter-base junction of transistor 44 causing it to conduct in its emitter-collector circuit and positively charge capacitor 37. The resultant increased voltage on capacitor 37 (the oscillator control voltage) causes the local oscillator frequency to increase, which, in turn, tends to cause the discriminator output voltage to return to zero. b On the other hand, if the local oscillator frequency is too high, the discriminator output voltage will be negative. Therefore, the emitter-base junction of transistor 33 will be reverse biased (keeping transistor 33 biased off) and the emitter-base junction of transistor 34 will be forward biased (biasing transistor 34 into conduction).

The base of transistor 40 is normally biased to a negative voltage ($V_c$) by resistor 38, maintaining transistor 40 at cutoff when transistor 34 is at cutoff. However, when transistor 34 conducts, the voltage at the base of transistor 40 is shifted toward zero, forward biasing the emitter-base junction of transistor 40 causing it conduct in its emitter-collector circuit and negatively charge (positively discharge) capacitor 37. The resultant decreased voltage on capacitor 37 causes the local oscillator frequency to decrease, which, in turn, tends to cause the discriminator output voltage to return to zero.

In the foregoing manner, the local oscillator frequency is stabilized at the desired frequency.

During the initializing, or reset period of operation, a signal is applied via terminal 30 to the gate of transistor 45. This causes transistor 45 to conduct and directly apply a preset voltage to capacitor 37. Because of the low resistance path through potentiometer 43 and transistor 45, the voltage on capacitor 37 very rapidly assumes the reset value.

Rapid sweeping of the local oscillator signal frequency is achieved by applying a signal to either terminal 52 or 53. To sweep the locl oscillator frequency downward from the reset frequency, a negative signal is applied to terminal 52, biasing transistor 49 into conduction. This creates a low resistance path from the base of transistor 40 to ground, causing transistor 40 to heavily conduct and negatively charge (positively discharge) capacitor 37 very rapidly.

During AFC operation, diode 61 is reverse biased and therefore, has no effect. During sweep, however, when transistor 40 is heavily conducting, diode 61 becomes forward biased, thereby effectively bypassing resistor 39. The effective RC time constant for discharging capacitor 37 is then determined by the relatively low resistance of resistor 60.

For sweeping the frequency of the local oscillator upwardly, transistor 46 operates in a manner analogous to transistor 49. That is, transistor 46 causes transistor 44 to conduct heavily, thereby positively charging capacitor 37 very rapidly. This action is enhanced by the operation of diode 63 in a manner analaogous to that described above for diode 61.

The above description is included to illustrate the operation of the preferred embodiment and is not meant to limit the scope of the invention. The scope of the invention is to be limited only by the following claims. From the above discussion, many variations would be apparent to one skilled in the art that would yet be encompassed by the spirit and scope of the invention.

What is claimed is:

1. An electronic system for automatically tuning to a selected frequency comprising:
   a frequency controllable oscillator; oscillator control means for controlling a frequency of an output signal of said oscillator, wherein entry of data related to said selected frequency causes said oscillator to monotonically and continuously change said frequency of said oscillator output signal;
   a reference signal generator;
   a mixing circuit for combining said oscillator output signal and an output signal from said generator;
   means for identifying said selected frequency of said oscillator output signal utilizing an output signal of said mixing circuit, said identification means including means for stopping said changing frequency of said oscillator output signal;
   first frequency control means comprising a receiver discriminator coupled to said oscillator control means and providing an automatic frequency control circuit utilizing said oscillator output signal and an external signal; and
   second frequency control means comprising a discriminator coupled between said mixing circuit and said oscillator control circuit for maintaining said oscillator output signal frequency at substantially said selected frequency in an absence of said external signal.

2. The electronic tuning system of claim 1 wherein said oscillator control means provides a first response time to signals from said first and said second frequency control means and a second response time to signals for monotonically changing said oscillator output signal frequency.

3. The electronic tuning system of claim 2 wherein said first and said second response time is related to a rate of change of charge of a capacitor, wherein said oscillator control means further includes switching means for changing a resistance value in response to said signals for changing said oscillator signal frequency, said resistance limiting said rate of change of charge.

4. The electronic automatic tuning system of claim 1 wherein output signals from said first and said second frequency control means are applied to an input terminal of said oscillator control means, said oscillator control means being moe responsive to said first frequency control output signals as compared to said second frequency control means output signals.

5. An improved automatic frequency control circuit of the type utilizing beat frequency signals and having signal frequencies above and below reference signal components, said AFC circuit having a reference signal generator, a voltage controlled oscillator, a mixing circuit for heterodyning the output signals of said reference signal generator and said voltage controlled oscillator to produce a beat frequency signal, and for providing an output signal of one polarity when said beat frequency signal is above a predetermined frequency and of the opposite polarity when said beat frequency signal in below said predetermined frequency, wherein the improvement comprises:

a discriminator amplifier for amplifying the output signal of said discriminator in response to a first control signal and for amplifying and inverting the output signal of said discrminator in the absence of said first control signal.

6. The automatic frequency control circuit of claim 5 wherein said discriminator amplifier comprises an operational amplifier and wherein said first control signal causes a first terminal of said operational amplifier to be at a higher potential than a second input terminal, and wherein absence of said control signal causes said first terminal to be at a lower potential than said second terminal.

7. The improved AFC circuit of claim 5 wherein said first control signal is generated when said beat frequency signal occurs at a frequency above a related one of said reference signal components.

8. An improved oscillator control circuit for providing control signals to a voltage controlled oscillattor in an automatic frequency tuning system having a first and a second automatic frequency control circuit, wherein the improvement comprises:

means for providing a control signal in the form of a voltage ramp signal to said voltage controlled oscillator in response to an enabling signal from said automatic frequency tuning system;

storage means for temporarily providing a control signal of substantially constant value upon removal of said enabling signal;

means for providing a control signal determined by an output signal of a first discriminator; and means for providing a control signal determined by an output signal of a second discriminator when said first discriminator signal is substantially zero.

9. An electronic automatic frequency tuning system, wherein said tuning system is used in a television receiver for reception of a broadcast signal, comprising:

a voltage controlled oscillator;

an oscillator control circuit for applying a voltage establishing the frequency of said oscillator;

a reference signal generator;

a first automatic frequency control circuit utilizing an output signal from said oscillator and said broadcast signal; and a second automatic frequency control circuit utilizing said oscillator output signal and an output signal from said reference signal generator, wherein said oscillator control circuit provides a ramp voltage applied to said oscillator in response to an enabling signal resulting from activation of said automatic frequency tuning system, wherein said first control circuit determines an output signal of said oscillator control circuit, and wherein said second control circuit determines said oscillator control circuit output signal in an absence of said enabling signal and in an absence of said broadcast signal.

10. The tuning system of claim 9 including means for presetting said oscillator control circuit output signal.

\* \* \* \* \*